(12) United States Patent
Reiha

(10) Patent No.: US 9,178,487 B2
(45) Date of Patent: Nov. 3, 2015

(54) METHODS AND APPARATUS FOR SIGNAL FILTERING

(71) Applicant: Nokia Corporation, Espoo (FI)

(72) Inventor: Michael Reiha, El Cerrito, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 13/930,528

(22) Filed: Jun. 28, 2013

(65) Prior Publication Data

US 2015/0002240 A1    Jan. 1, 2015

(51) Int. Cl.
| | |
|---|---|
| *H01P 1/20* | (2006.01) |
| *H03H 7/01* | (2006.01) |
| *H03H 9/52* | (2006.01) |
| *H03H 9/64* | (2006.01) |
| *H03H 11/12* | (2006.01) |

(52) U.S. Cl.
CPC .............. *H03H 7/0169* (2013.01); *H01P 1/20* (2013.01); *H03H 7/0161* (2013.01); *H03H 7/1708* (2013.01); *H03H 9/52* (2013.01); *H03H 9/6433* (2013.01); *H03H 9/6479* (2013.01); *H03H 11/1291* (2013.01)

(58) Field of Classification Search
USPC ......................................... 333/132, 202–205
See application file for complete search history.

(56) References Cited

U.S. PATENT DOCUMENTS

| | | | |
|---|---|---|---|
| 4,418,324 A | 11/1983 | Higgins | 333/204 |
| 5,608,363 A | 3/1997 | Cameron et al. | 333/202 |
| 6,239,673 B1 | 5/2001 | Wenzel et al. | 333/202 |
| 6,529,750 B1 * | 3/2003 | Zhang et al. | 505/210 |
| 7,468,642 B2 * | 12/2008 | Bavisi et al. | 333/168 |
| 7,639,101 B2 * | 12/2009 | Tsuzuki et al. | 333/99 S |
| 7,719,382 B2 * | 5/2010 | Tsuzuki et al. | 333/99 S |
| 8,324,984 B2 | 12/2012 | Gavin et al. | 333/132 |
| 2012/0286900 A1 | 11/2012 | Kadota et al. | 333/188 |

OTHER PUBLICATIONS

3GPP TS 36.101 V10.3.0 (Jun. 2011); 3rd Generation Partnership Project; Technical Specification Group Radio Access Network; Evolved Universal Terrestrial Radio Access (E-UTRA); User Equipment (UE) radio transmission and reception (Release 10) (237 pages).

Amari, S.; Dept. of Electr. & Comput. Eng., R. Mil. Coll., Kingston, Ont., Canada ; Rosenberg, U.; "Synthesis and design of novel in-line filters with one or two real transmission zeros," *Microwave Theory and Techniques, IEEE Transactions on* (vol. 52 , Issue: 5), May 2004, Abstract.

Wing-Yan Leung, Kwok-Keung M. Cheng, Member, IEEE, and Ke-Li Wu; "Multilayer LTCC Bandpass Filter Design With Enhanced Stopband Characteristics," *IEEE Microwave and Wireless Components Letters*, vol. 12, No. 7, Jul. 2002 (3 pages).

(Continued)

*Primary Examiner* — William Hernandez
(74) *Attorney, Agent, or Firm* — Harrington & Smith

(57) ABSTRACT

Systems and techniques for filtering of radiofrequency signals. A plurality of tunable cross-couple resonators are connected using capacitive coupling elements to form a cross-coupled bandpass filter. A center frequency of the filter may be set based on frequencies of the resonators and a fractional bandwidth of the filter may be set based on states of the capacitive coupling elements. Programmable zeroes of the filter may be set based on states of reactive elements coupling selected pairs of the resonators. The reactive elements may be capacitive, for zeroes below the center frequency, or inductive, for zeroes above the center frequency.

20 Claims, 12 Drawing Sheets

(56) References Cited

OTHER PUBLICATIONS

Naglich, Eric J.; Dept. of Electr. & Comput. Eng., Purdue Univ., West Lafayette, IN, USA ; Juseop Lee ; Peroulis, D. ; Chappell, W.J.; "A Tunable Bandpass-to-Bandstop Reconfigurable Filter With Independent Bandwidths and Tunable Response Shape," *Microwave Theory and Techniques, IEEE Transactions on* (vol. 58 , Issue: 12 ), Dec. 2010, Abstract.

H. Salehi, Student Member, IEEE, A. H. Majedi, Member, IEEE, and R. R.Mansour; "Analysis and Design of Superconducting Left-Handed Transmission Lines," IEEE Transactions on Applied Superconductivity, vol. 15, No. 2, Jun. 2005 (4 pages).

Robert A. Surette and Robert F. Liebe; "Introduction to Cross-Coupling in RF Filter Design," Shively Labs® © 2000 (6 pages).

Amari, S.; Dept. of Electr. & Comput. Eng., R. Mil. Coll., Kingston, Ont., Canada ; Rosenberg, U.; "Synthesis and design of novel in-line filters with one or two real transmission zeros," *Microwave Theory and Techniques, IEEE Transactions on* (vol. 52 , Issue: 5), May 2004 (15 pages).

Naglich, Eric J.; Dept. of Electr. & Comput. Eng., Purdue Univ., West Lafayette, IN, USA ; Juseop Lee ; Peroulis, D. ; Chappell, W.J.; "A Tunable Bandpass-to-Bandstop Reconfigurable Filter With Independent Bandwidths and Tunable Response Shape," *Microwave Theory and Techniques, IEEE Transactions on* (vol. 58 , Issue: 12 ), Dec. 2010 (10 pages).

\* cited by examiner

METHODS AND APPARATUS FOR SIGNAL FILTERING

TECHNICAL FIELD

The present invention relates generally to wireless communication. More particularly, the invention relates to improved systems and techniques for tuning of center frequencies, fractional bandwidths and transmission nulls, or zeroes, in bandpass filters.

BACKGROUND

As the popularity of wireless cellular data communications devices, and the demands made on them, continue to increase, the demands on the frequency spectrum available for such communication become greater and greater, with network operators and device manufacturers under increasing pressure to use frequencies as efficiently as possible in order to avoid saturating the available frequency bands.

SUMMARY

In one embodiment of the invention, an apparatus comprises a cross-coupled bandpass filter characterized by a tunable center frequency, and one or more programmable zeroes.

In another embodiment of invention, a method comprises tuning a cross-coupled bandpass filter by setting frequencies of a plurality of cross-coupled tunable resonators to set a center frequency of the filter, setting states of tunable capacitive elements coupling the tunable resonators to set a fractional bandwidth of the filter, and setting states of tunable capacitive elements coupling members of selected pairs of the tunable resonators to set programmable zeroes of the filter.

In another embodiment of the invention, an apparatus comprises a cross-coupled bandpass filter comprising a plurality of tunable resonators configured such that the center frequency of the filter is based at least in part on states of one or more of the tunable resonators, the tunable resonators are connected one to another by tunable capacitive elements configured such that a fractional bandwidth of the filter is based at least in part on states of one or more of the tunable capacitive elements, and members of at least one selected pair of the resonators are each connected to one another by a tunable reactive element, wherein each of the tunable reactive elements is configured such that characteristics of a zero of the filter are based at least in part on a state of a tunable reactive element associated with the zero.

DETAILED DESCRIPTION

Figure 1:
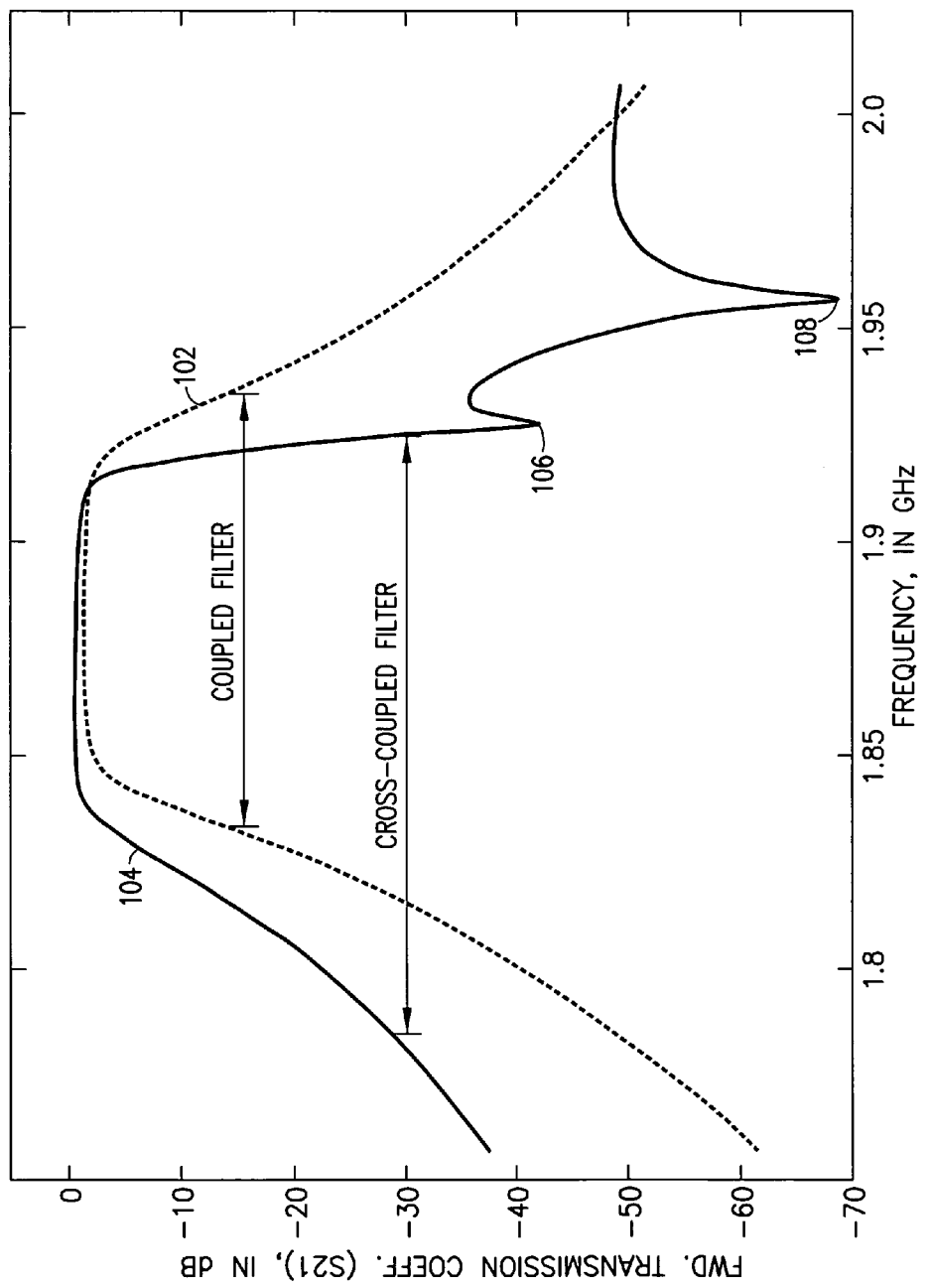
FIG. 1 illustrates a graph showing forward transmission coefficient against frequency for coupled and cross-coupled filters.

Embodiments of the present invention recognize that modern wireless communication devices use numerous frequency bands that are closely spaced in order to accommodate as many devices in close physical proximity to one another as possible. At least one anticipated implementation of third generation partnership project (3GPP) long term evolution (LTE) systems is expected to support 29 frequency division duplex (FDD) and 11 time division duplex (TDD) single-carrier bands. Embodiments of the present invention recognize that however many bands are supported by network implementations, it is desirable for communication devices to be able to operate in as many bands as possible in order to allow selection of a band that minimizes interference between devices operating in close physical proximity to one another. In order for devices to operate in multiple bands, they must be able to filter out undesired frequencies, and must be capable of a substantial level of stop-band rejection. Frequently, higher levels of stop-band rejection are accompanied by higher levels of insertion loss and, therefore, lower receiver sensitivity. Insertion loss can be reduced while maintaining stop-band rejection by employing a cross-coupled filter structure. FIG. 1 illustrates, as an example, forward transmission provided by coupled resonator and cross-coupled resonator transmit filters for LTE Band 25. FIG. 1 presents curves 102 and 104, each showing the relationship between forward transmission coefficient (S21), measured in dB, and frequency, measured in GHz. The curve 102 presents the relationship for a prior-art coupled filter, and the curve 104 presents the relationship for a prior-art cross-coupled filter. In the presently illustrated example, the cross-coupled filter is shown (as compared to the coupled filter) to reduce insertion loss and increase stop-band rejection, for one attenuation skirt (in this case, the high-side skirt). Stop-band rejection is reduced by introducing two transmission zeroes 106 and 108, at the expense of reducing attenuation on the low-side skirt. The improved attenuation skirt, with no increase in the filter's unloaded quality factor, attenuates transmit power leakage emanating into the receiver path, and can represent an important approach to improving receiver sensitivity in FDD cellular systems such as LTE. Cross-coupling (understood in the art as encompassing a filter design that provides for undesired frequencies at both ends of the filter to cancel one another out) can substantially improve performance, while substantially reducing the size and complexity of filters as compared to a design that uses additional filtering components to remove such frequencies.

To the extent that the ability to adapt filtering is limited, increasing the number of frequency bands in a system increases the likelihood of corrupted reception due to interfering carriers, or blockers, in addition to self-corruption, such as transmitter power leakage into a receiver during fixed division duplex operation. As illustrated in FIG. 1 and discussed above, the use of cross-coupled filtering helps reduce transmitter power leakage and other undesirable effects, but prior-art cross-coupled filters are difficult to vary in such a way that a single such filter can be used with numerous different bands.

Current filter technologies, in fact, are only able to support one single-carrier band per filter count, and discrete component filters are bulky and costly and complicate front-end design for both FDD and TDD devices. Increasing the band count, that is, the number of frequency bands to be supported, greatly complicates the front-end design if a separate filter must be implemented for each band. Particularly if discrete components are to be used, design of a device with multiple filters to accommodate multiple bands is likely to be so complex and costly that the device will be able to operate only in relatively few bands.

Important properties for bandpass filtering are low insertion loss operation and good stop band rejection, particularly in environments in which many bands are being accommodated. Embodiments of the present invention recognize that unable filter design greatly improves the ability to accommodate multiple frequency bands, and that tuning of transmission zeroes provides for greatly improved interference cancellation. Therefore, in one or more embodiments, the invention provides for a tunable center frequency $f_0$ and fractional bandwidth FBW×$f_0$, together with the ability to tune transmission zeroes at both higher and lower attenuation skirts. Such properties may be implemented, for example, in a cross-coupled resonator bandpass filter. At least one of the transmission zeroes may be programmable to an offset frequency of the receive-band edge minus the transmit-band edge in order to insure a desired stop-band rejection.

Filters according to one or more embodiments of the present invention provide flexible frequency admission and rejection while providing for good stop band rejection and low insertion loss. Such a filter may take the form of a cross-coupled bandpass filter that exhibits:

a tunable center frequency $f_0$, mechanisms to adjust the fractional bandwidth FBW, mechanisms for enabling transmission zeroes, or nulls, for increased interference cancellation, and without adversely affecting filter performance (for example, $f_0$ and FBW)

providing one or two transmission zeroes, or nulls, for interference cancellation and/or increasing band-edge attenuation providing tunable nulls that reside below and above the band center frequency for receive and transmit modes, respectively.

Tunable $f_0$ and FBW allow for band and mode adaptability. For example, such tunability allows for reconfiguration from WCDMA Band IV to LTE Band 25, and switched enabled transmission nulls allow a filter to toggle between operation as a cross-coupled bandpass filter (transmission null enabled) and a coupled bandpass filter (transmission null disabled). Tunable transmission nulls provide a number of benefits: attenuating interfering in-band blockers; increasing out-of-band rejection, particularly bands such as UMTS bands with narrow band-edge to band-edge spacing; attenuating leakage of transmit signal power into the receiver port; and attenuation of transmit noise.

Embodiments of the present invention provide for tunable transmission nulls for both receive and transmit filters, and allow for implementation in a reconfigurable radio implementing the option of multiple tunable nulls, the options of enabling and disabling these nulls, the option of locating multiple nulls at a single frequency for increased attenuation, and the option of implementing tunable nulls residing below and above the band center frequency for receive and transmit modes, respectively.

Figure 2A:
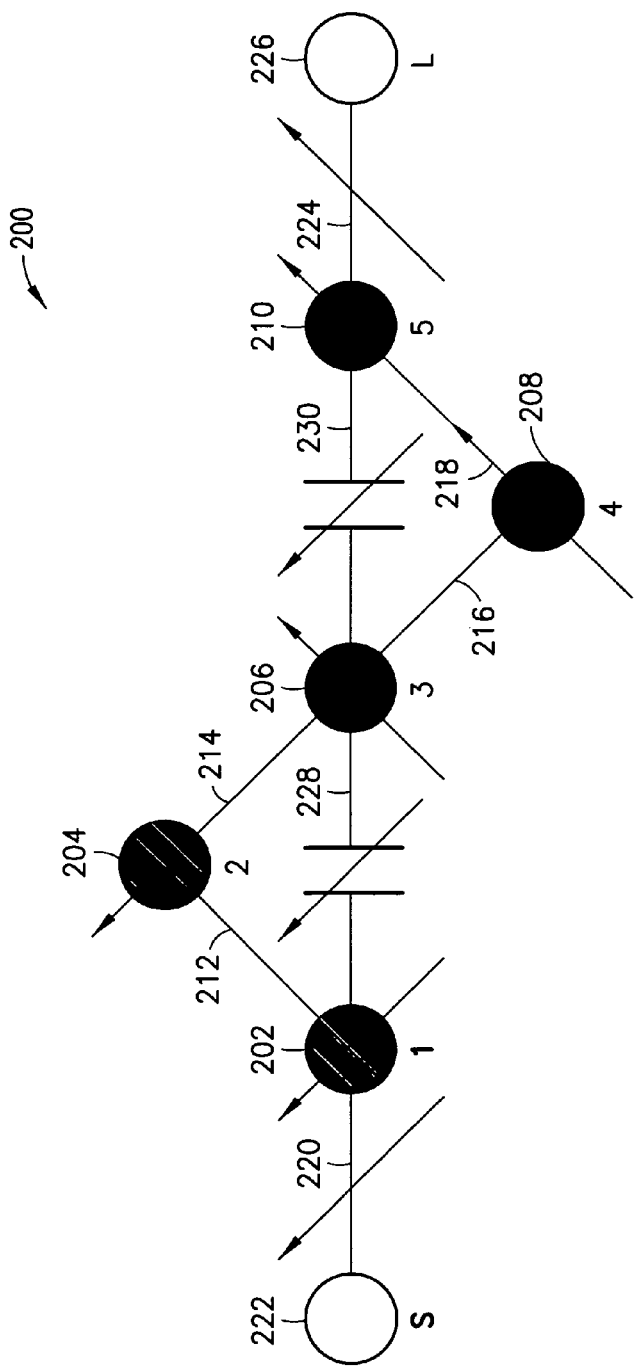
FIGS. 2A and 2B illustrate filters according to embodiments of the present invention.
Figure 2B:
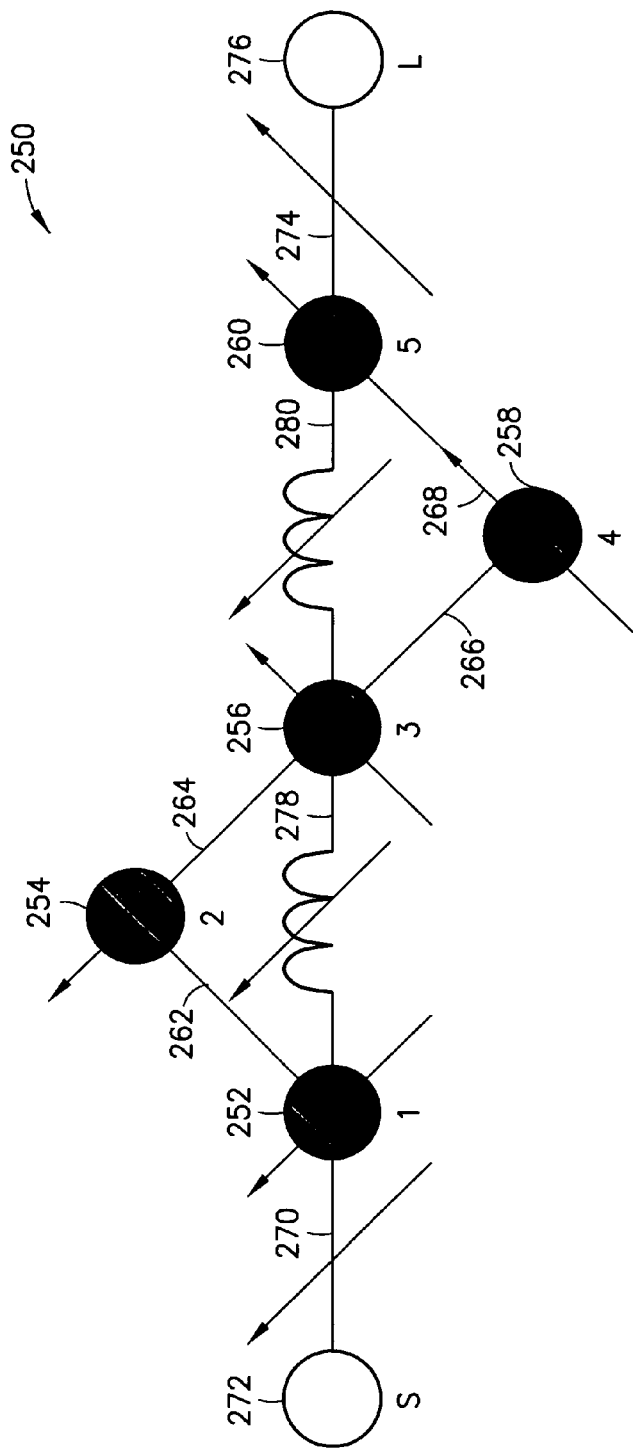

FIGS. 2A and 2B illustrate filters 200 and 250, respectively, according to an embodiment of the present invention. Each of the filters 200 and 250 provides for a tunable frequency and one or more tunable zeroes. In the present example, the filter 200 may be used as a receive filter and the filter 250 may be used as a transmit filter.

The receive filter 200 comprises five resonators 202, 204, 206, 208, and 210. The resonators 202-210 are connected by capacitive coupling elements (connecting 202 and 204) 214 (connecting 204 and 206), 216 (connecting 206 and 208), and 218 (connecting 208 and 210), and the filter 200 is coupled by a tunable capacitive coupling element 220 to a source 222, and by a tunable capacitive coupling element 224 to a load 226. The center frequency of the filter 200 is controlled by tuning the center frequency of the resonators, while the fractional bandwidth is varied by the capacitive coupling between successive resonators that is provided by the elements 212, 214, 216, and 218. The programmable nulls are controlled by a tunable reactive element, which may suitably be a tunable capacitive element, or tunable capacitor 228, between the resonators 202 and 206 and a tunable reactive element, which may suitably be a tunable capacitive element, or unable capacitor 230, between the resonators 206 and 210. The programmable nulls appear below the center frequency of the filter.

The transmit filter 260 comprises five resonators 252, 254, 256, 258, and 260. The resonators 252-250 are connected by capacitive coupling elements 262 (connecting 252 and 204), 264 (connecting 254 and 256), 266 (connecting 256 and 258), and 268 (connecting 258 and 250). The filter 250 is coupled (at the resonator 252) by a tunable capacitive coupling element 270 to a source 272, and (at the resonator 260) by a tunable capacitive coupling element 274 to a load 276. The center frequency of the filter 200 is controlled by tuning the center frequency of the resonators, while the fractional bandwidth is varied by the capacitive coupling between successive resonators that is provided by the elements 262, 264, 266, and 268. The programmable nulls are controlled by tunable reactive elements, such as an inductive element 278 between the resonators 252 and 256 and an inductive element 280 between the resonators 256 and 260.

In the description above, the filter 200 has been described as the receive filter and the filter 250 has been described as the transmit filter, but it will be recognized that such a designation merely indicates a particular exemplary usage and is not dictated by the structure or design of the filters. Rather, either filter may be used as the transmit or receive filter and the other filter may be used as the converse filter. depending on the particular filter characteristics needed for each function. For example, LTE FDD bands 13, 14, and 20 would use the filter 250 as a receive path filter and the filter 200 as a transmit path filter. Both filters can be used, for example, in an LTE or universal mobile terrestrial service (UMTS) FDD duplexer or in LTE TDD filters.

Filters according to one or more embodiments of the present invention may, in appropriate uses, such as for TDD LTE, be implemented as stand-alone filter components. The filters may be implemented as a 5-state cross-couple bandpass filter in order to synthesize two independently tunable transmission zeros that maintain transmission zeros at DC and infinite frequencies. The cross-coupled network can be enabled and disabled through switches. When enabled, the insertion loss of the filter is improved. When disabled, the bandpass response is symmetric.

In one or more other uses, such as for FDD operation, the filters may be configured together in a tunable duplexer apparatus. The filters may each be implemented as a 5-stage cross-coupled bandpass filter in order to synthesize two independently tunable transmission zeros that maintain transmission zeros at DC and infinite frequencies. The cross-coupled network may be enabled or disabled through switches, with the insertion loss of the filter being improved when the network is enabled, and with the bandpass response being symmetric when the network is disabled, the bandpass response is symmetric. When the cross-coupled network is enabled, one or two transmission zeros (in at least one exemplary embodiment) are synthesized. The transmission zeros may be used to mitigate blocking signals, from the external environment, such as in other mobile communication devices, or from the internal environment, such as in the case of self transmitter leakage.

The transmission zeros may be used to improve the slope of out-of-band attenuation, allowing transmit and receive filters to be used in a duplexer with narrow band-to-band spacings. For example, this may be 20 MHz for use with LTE Band 2. Transmission zeros for receive filters may use capacitors that couple resonators 202 to 206 and 206 to 210, respectively.

Transmission zeroes for the transmit filters may use inductance values, but not inductors, that couple resonators 252 to 256 and 256 to 260, respectively.

Transmission zeroes for the receive filters and (for example) for Bands 13, 14, 20 use inductance values, but not inductors, that couple resonators 202 to 206 and 206 to 210, respectively.

Transmission zeros for the transmit filters and for Bands 13, 14, 20 may use capacitors that couple resonators 252 to 256 and 256 to 260, respectively.

Transmission zero frequencies for the transmit filter may be adjusted by varying the tunable inductance values (not inductors) and do not affect the input reflection response or other attributes of the filter.

Transmission zero frequencies for the receive filter may be adjusted by varying the tunable capacitor values and do not affect the input reflection response or other attributes of the filter.

Figure 3A:
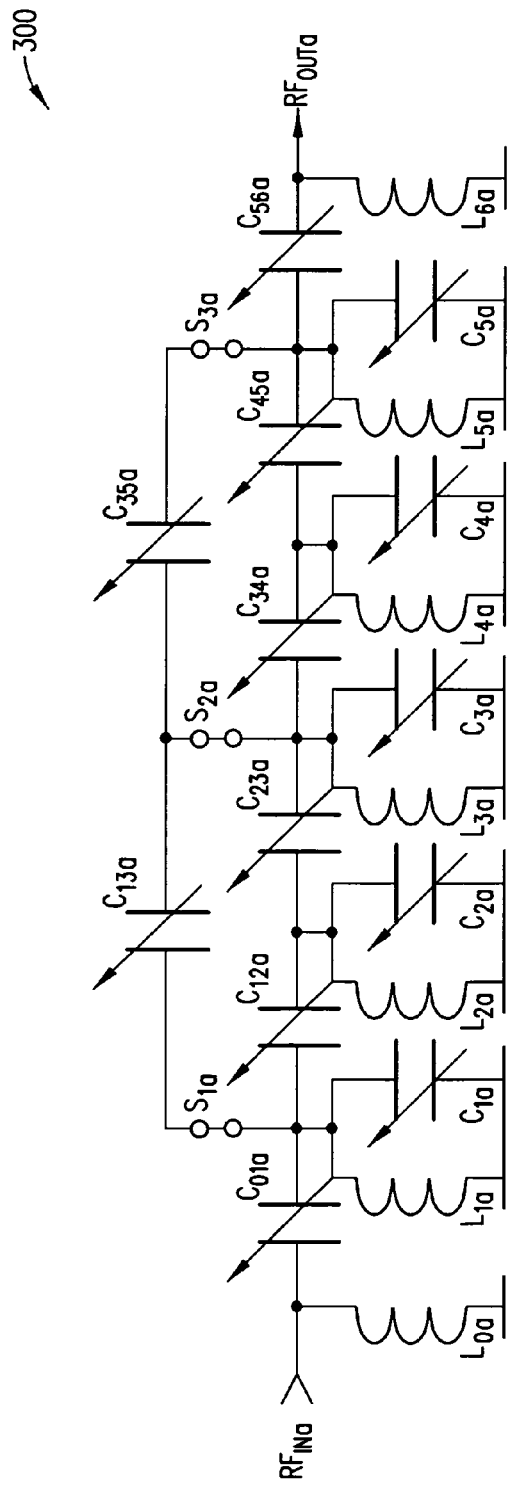
FIGS. 3A and 3B illustrate electrical models of filters according to embodiments of the present invention.
Figure 3B:
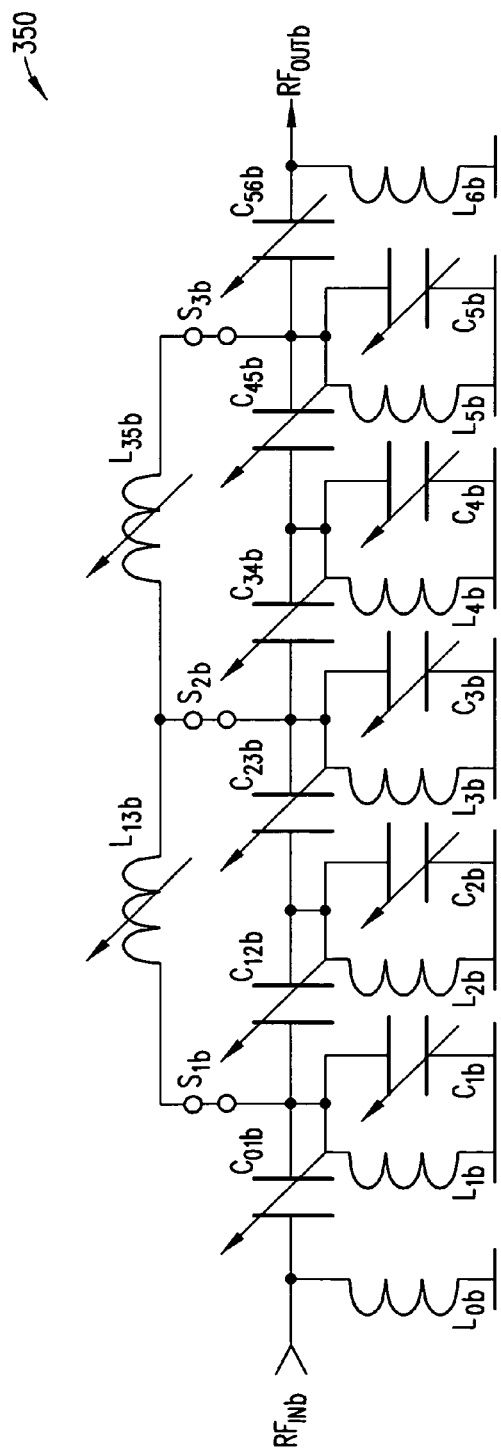

FIG. 3 illustrates electrical models 300 and 350 for receive and transmit mode filters, respectively. In both cases, inductors $L_{0a}$, $L_{6a}$, $L_{0b}$, $L_{6b}$ are fixed to a particular value. Inductances $L_{13b}$, $L_{35b}$ need not be synthesized with lumped inductors but may instead be synthesized and controlled with a network of phase shifters and capacitors. Switches $S_{1a}$, $S_{2a}$, $S_{3a}$, $S_{1b}$, $S_{2b}$, $S_{3b}$ may be used to enable (with the switches in a closed state) or disable (with the switches in an open state) programmable nulls, that is, transmission zeroes, used for interference cancellation and improved stop-band rejection. Capacitors $C_{01a}$, $C_{01b}$, $C_{56a}$, $C_{56b}$ and inductors $L_{0a}$, $L_{6a}$, $L_{0b}$, $L_{6b}$ may form matching networks used to match the filters to an impedance $Z_0$ of a system in which the filters are used.

The system impedance remains fixed across bands. Inductors $L_{1a,b}$-$L_{5a,b}$ may be a matter of design choice and, for simplicity, may in the present exemplary embodiment share the same value. When the programmable nulls are disabled, the capacitor pairings $C_{1a,b}$, $C_{5a,b}$, and $C_{2a,b}$, $C_{4a,b}$ are identical in value. When the nulls are enabled, all resonators are asymmetrically tuned and the shift in frequency arises from frequency-invariant susceptance B. A five-stage bandpass filter is chosen in order to yield at least two transmission zeros without using transmission zeros that are inherently placed at DC or infinite frequency. This ensures that stop-band rejection improves with the increasing frequency, offset from the filter center frequency.

Figure 4:
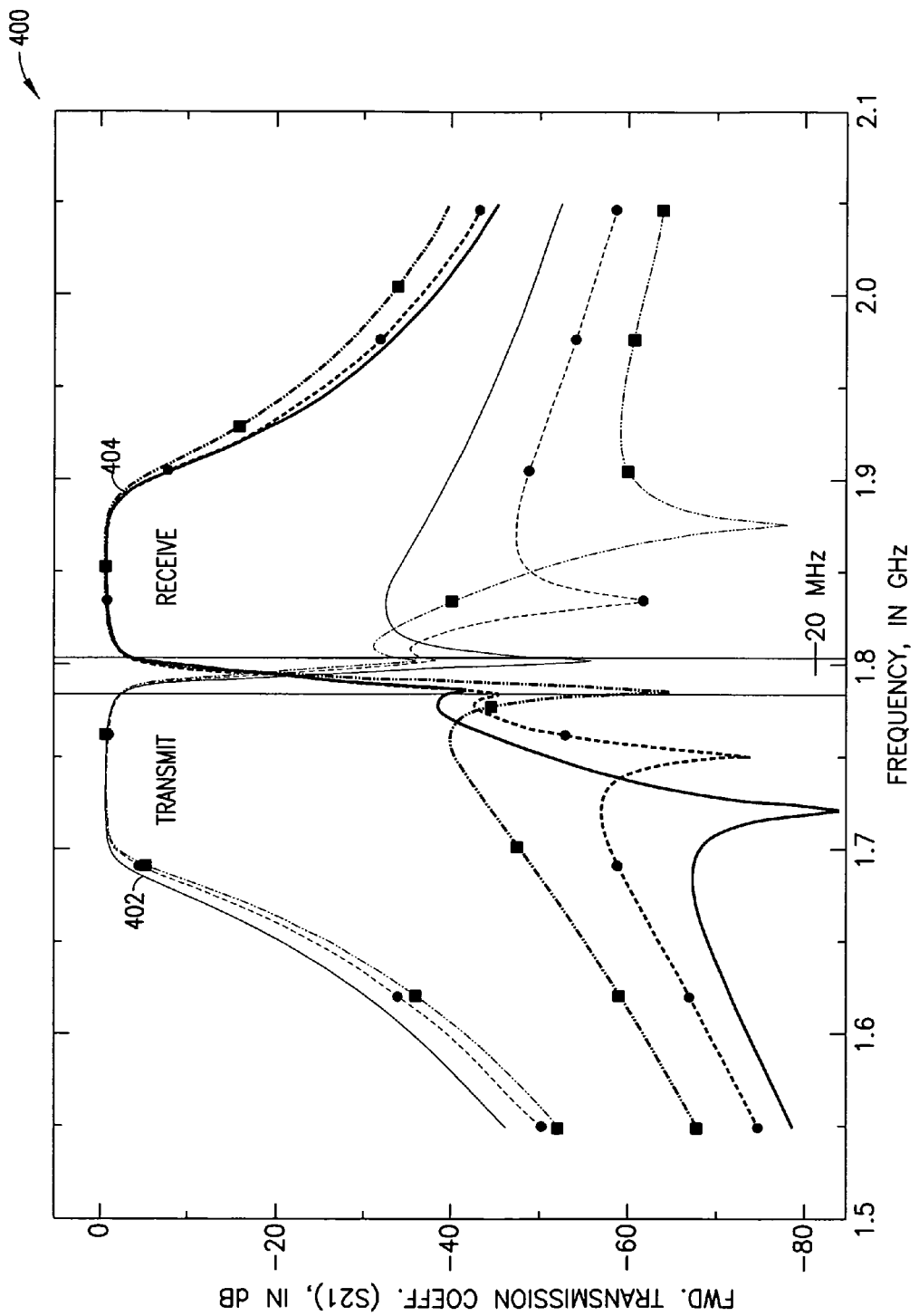
FIGS. 4-6 illustrate graphs of signal characteristics of filters according to embodiments of the present invention.

FIG. 4 illustrates a graph 400 showing the forward transmission coefficients 402 and 404, respectively, of receive andtransmit filters, with programmable nulls enabled and tuned.

Each filter is designed to accommodate two nulls for interference cancellation. The first null of the transmit filter is programmed at the lower band edge of the receive filter (for example 1805 MHz in LTE Band 3) while the first null of the receive filter is programmed at the upper edge of the transmit filter (for example, 1785 MHz in LTE Band 3). The second set of nulls can be programmed such that, $$f_{null,TX} - f_{null,RX} = \text{full-duplex offset,} \qquad (1)$$

In this example, the second set of nulls is programmed at either band edge and in the center of the band. As a result, the transmit power at full-duplex offset is effectively reduced at the transmitter output. In addition in-band transmit power, leaking into the receiver is effectively reduced by the receive filter.

Both scenarios are descriptive of FDD operation when the filters, for example, are configured in a duplexer. The second set of nulls can be programmed independently in scenarios that are necessary to cancel other blocker signals. These filters can also be used independently for LTE TDD operation.

Figure 5:
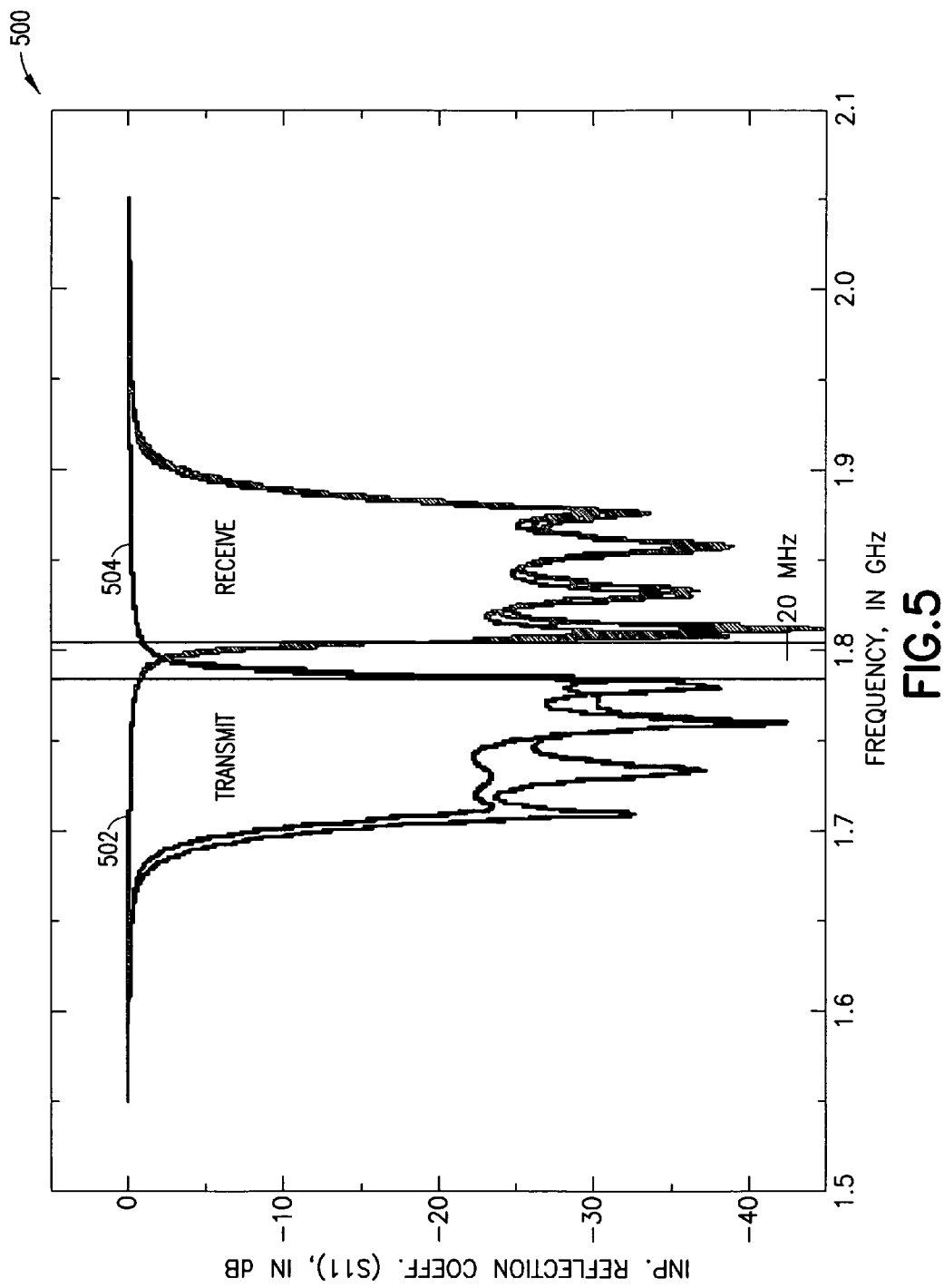

FIG. 5 illustrates a graph 500 showing input reflection coefficient curves 502 and 504, respectively, for the receive and transmit filters whose coefficients are shown in FIG. 4 and over the previously mentioned programmable null scenarios. For both filters, the input power matching varies only slightly and, therefore, the filter architecture and tuning method are effective, particularly as they do not negatively impact VSWR.

Figure 6:
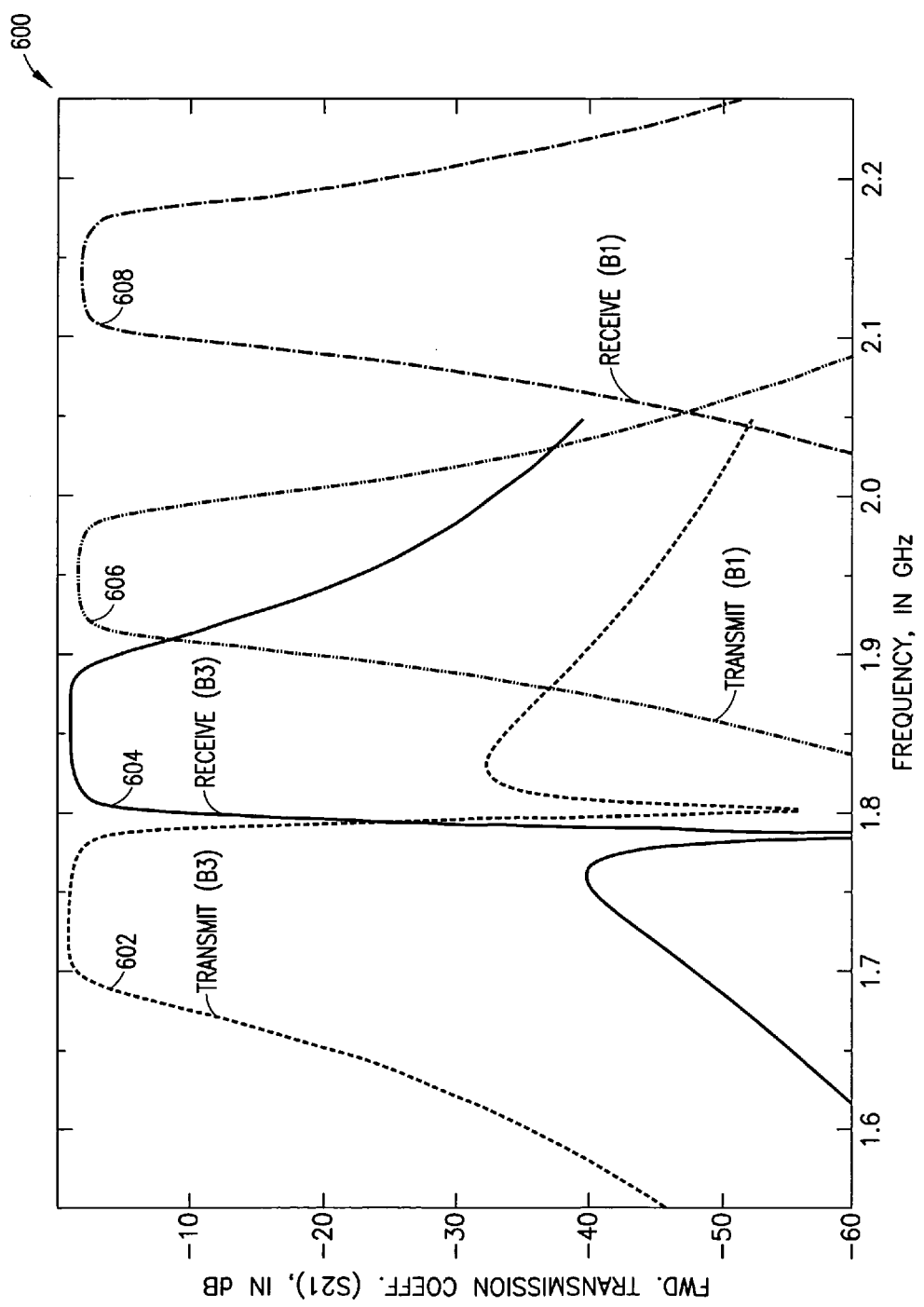

FIG. 6 illustrates a graph 600 showing band-to-band tunability of the filters in an exemplary scenario for use in a transition from LTE Band 3 to LTE Band 1. In the LTE Band 3 scenario, transmit filter curve 602 and receive filter curve 604 each have both programmable nulls centered at their cohort's respective band-edge. The LTE Band 1 scenario, illustrated by transmit curves 606 and receive curves 608, does not require interference nulls to be programmed because the full-duplex frequency spacing is 190 MHz which, with a fifth-order filter, provides sufficient stop-band rejection at the duplex offset spacing (for example, more than 40 dB). In this scenario, the switches (see FIG. 3) are open and only capacitors are used to adjust and tune the fractional bandwidths and center frequencies, respectively.

Table 1 below lists the electrical values required for one transmit filter that covers Bands 1, 4, 7, 10, 25, Bands 2, 3, 25 utilize the programmable transmission zeros needed for interference cancellation. Switches are disabled for Bands 1, 4, 7, 10. Matching inductors $L_0$, $L_6$ are depicted with their respective values and also with the highest inductance value used in the group (e.g., 3.75 nH), listed in the shaded rows. The objective of using one inductance value, common for all bands in the group, is to avoid the use of tunable inductors. The tunable inductance values $L_{13}$, $L_{35}$ are, in the present example, not implemented as inductors but rather, are synthesized as a network of switchable capacitors and phase shifters. The particular inductance structure described here is not limiting, but is simply presented here as one exemplary way in which an appropriate inductance structure may be implemented.

TABLE 1

Tunable transmit filter electrical values in a 50 Ω system (L in nH, C in pF).

| | Transmit Band | | | | | | | | | | | | |
|---|---|---|---|---|---|---|---|---|---|---|---|---|---|
| | 1 | 2 | | | 3 | | | 4 | 7 | 10 | 25 | | |
| | | A | B | C | A | B | C | | | | A | B | C |
| $L_0$ | 3.25 | 3.25 | 3.25 | 3.25 | 2.90 | 2.90 | 2.90 | 3.75 | 3.00 | 3.25 | 3.12 | 3.12 | 3.12 |
| $L_0$ | 3.75 | 3.75 | 3.75 | 3.75 | 3.75 | 3.75 | 3.75 | 3.75 | 3.75 | 3.75 | 3.75 | 3.75 | 3.75 |
| $L_1$ | 0.10 | 0.10 | 0.10 | 0.10 | 0.10 | 0.10 | 0.10 | 0.10 | 0.10 | 0.10 | 0.10 | 0.10 | 0.10 |
| $C_1$ | 62.57 | 67.63 | 67.44 | 65.8 | 77.22 | 77.21 | 77.21 | 80.05 | 37.05 | 81.00 | 67.36 | 71.68 | 67.01 |
| $L_2$ | 0.10 | 0.10 | 0.10 | 0.10 | 0.10 | 0.10 | 0.10 | 0.10 | 0.10 | 0.10 | 0.10 | 0.10 | 0.10 |
| $C_2$ | 63.22 | 67.19 | 66.39 | 67.0 | 75.78 | 75.75 | 75.74 | 80.81 | 37.61 | 81.59 | 66.68 | 66.87 | 67.04 |
| $L_3$ | 0.10 | 0.10 | 0.10 | 0.10 | 0.10 | 0.10 | 0.10 | 0.10 | 0.10 | 0.10 | 0.10 | 0.10 | 0.10 |
| $C_3$ | 63.82 | 69.52 | 69.28 | 69.20 | 79.75 | 79.29 | 79.13 | 81.45 | 37.93 | 82.48 | 69.46 | 69.10 | 69.00 |
| $L_4$ | 0.10 | 0.10 | 0.10 | 0.10 | 0.10 | 0.10 | 0.10 | 0.10 | 0.10 | 0.10 | 0.10 | 0.10 | 0.10 |
| $C_4$ | 63.22 | 67.19 | 67.16 | 67.15 | 75.78 | 76.04 | 76.29 | 80.80 | 37.61 | 81.59 | 66.68 | 66.65 | 66.64 |
| $L_5$ | 0.10 | 0.10 | 0.10 | 0.10 | 0.10 | 0.10 | 0.10 | 0.10 | 0.10 | 0.10 | 0.10 | 0.10 | 0.10 |
| $C_5$ | 62.57 | 67.63 | 67.60 | 67.61 | 77.22 | 76.79 | 76.69 | 80.05 | 37.05 | 81.00 | 67.36 | 67.36 | 67.36 |
| $L_6$ | 3.25 | 3.25 | 3.25 | 3.25 | 2.90 | 2.90 | 2.90 | 3.75 | 3.00 | 3.25 | 3.11 | 3.12 | 3.12 |
| $L_6$ | 3.75 | 3.75 | 3.75 | 3.75 | 3.75 | 3.75 | 3.75 | 3.75 | 3.75 | 3.75 | 3.75 | 3.75 | 3.75 |
| $C_{01}$ | 2.00 | 2.21 | 2.21 | 2.21 | 2.86 | 2.86 | 2.85 | 2.25 | 1.31 | 2.67 | 2.30 | 2.30 | 2.29 |
| $C_{12}$ | 1.99 | 1.99 | 2.15 | 2.19 | 2.93 | 2.88 | 2.86 | 2.14 | 1.06 | 2.96 | 2.05 | 2.31 | 2.36 |
| $C_{23}$ | 1.40 | 1.32 | 1.48 | 1.52 | 1.89 | 1.87 | 1.86 | 1.50 | 0.743 | 2.07 | 1.33 | 1.58 | 1.64 |
| $C_{34}$ | 1.40 | 1.32 | 1.31 | 1.31 | 1.89 | 2.26 | 2.35 | 1.50 | 0.743 | 2.07 | 1.33 | 1.31 | 1.31 |
| $C_{45}$ | 2.00 | 1.99 | 1.97 | 1.97 | 2.93 | 3.30 | 3.38 | 2.14 | 1.06 | 2.96 | 2.05 | 2.02 | 2.01 |
| $C_{56}$ | 2.00 | 2.21 | 2.21 | 2.21 | 2.86 | 2.86 | 2.85 | 2.25 | 1.31 | 2.67 | 2.30 | 2.30 | 2.29 |
| $L_{13}$ | - | 6.99 | 11.9 | 16.59 | 4.40 | 4.36 | 4.35 | - | - | - | 5.52 | 10.11 | 14.5 |
| $L_{35}$ | - | 6.99 | 6.95 | 6.94 | 4.40 | 7.89 | 11.58 | - | - | - | 5.52 | 5.48 | 5.46 |
| $S_1$ | off | on | on | on | on | on | on | off | off | off | on | on | on |
| $S_2$ | off | on | on | on | on | on | on | off | off | off | on | on | on |
| $S_3$ | off | on | on | on | on | on | on | off | off | off | on | on | on |

| | Receive Band | | | | | | | | | | | | |
|---|---|---|---|---|---|---|---|---|---|---|---|---|---|
| | 1 | 2 | | | 3 | | | 4 | 7 | 10 | 25 | | |
| | | A | B | C | A | B | C | | | | A | B | C |
| $L_0$ | 3.25 | 3.25 | 3.25 | 3.24 | 2.90 | 2.90 | 2.90 | 3.75 | 3.00 | 3.25 | 3.12 | 3.12 | 3.12 |
| $L_0$ | 3.75 | 3.75 | 3.75 | 3.75 | 3.75 | 3.75 | 3.75 | 3.75 | 3.75 | 3.75 | 3.75 | 3.75 | 3.75 |
| $L_1$ | 0.1 | 0.1 | 0.1 | 0.1 | 0.1 | 0.1 | 0.1 | 0.1 | 0.1 | 0.1 | 0.1 | 0.1 | 0.1 |
| $C_1$ | 55.3 | 65.7 | 65.8 | 65.8 | 74.5 | 74.5 | 74.4 | 55.7 | 35.9 | 55.3 | 65.7 | 65.7 | 65.6 |
| $L_2$ | 0.1 | 0.1 | 0.1 | 0.1 | 0.1 | 0.1 | 0.1 | 0.1 | 0.1 | 0.1 | 0.1 | 0.1 | 0.1 |
| $C_2$ | 55.3 | 66.2 | 66.5 | 67.0 | 75.2 | 75.5 | 76.4 | 55.7 | 35.9 | 55.3 | 67.2 | 66.4 | 67.1 |
| $L_3$ | 0.1 | 0.1 | 0.1 | 0.1 | 0.1 | 0.1 | 0.1 | 0.1 | 0.1 | 0.1 | 0.1 | 0.1 | 0.1 |
| $C_3$ | 55.3 | 65.5 | 65.6 | 65.5 | 74.1 | 74.1 | 73.9 | 55.7 | 35.9 | 55.3 | 65.4 | 65.4 | 65.3 |
| $L_4$ | 0.1 | 0.1 | 0.1 | 0.1 | 0.1 | 0.1 | 0.1 | 0.1 | 0.1 | 0.1 | 0.1 | 0.1 | 0.1 |
| $C_4$ | 55.3 | 66.9 | 67.0 | 67.0 | 76.5 | 76.5 | 76.4 | 55.7 | 35.9 | 55.3 | 66.2 | 67.2 | 67.1 |
| $L_5$ | 0.1 | 0.1 | 0.1 | 0.1 | 0.1 | 0.1 | 0.1 | 0.1 | 0.1 | 0.1 | 0.1 | 0.1 | 0.1 |
| $C_5$ | 55.3 | 65.7 | 65.8 | 65.8 | 74.5 | 74.5 | 74.4 | 55.7 | 35.9 | 55.3 | 65.7 | 65.7 | 65.6 |
| $L_6$ | 3.25 | 3.25 | 3.25 | 3.24 | 2.90 | 2.90 | 2.89 | 3.75 | 3.00 | 3.25 | 3.12 | 3.12 | 3.12 |
| $L_6$ | 3.75 | 3.75 | 3.75 | 3.75 | 3.75 | 3.75 | 3.75 | 3.75 | 3.75 | 3.75 | 3.75 | 3.75 | 3.75 |
| $C_{01}$ | 1.70 | 2.03 | 2.03 | 2.03 | 2.57 | 2.57 | 2.57 | 1.48 | 1.19 | 1.70 | 2.10 | 2.11 | 2.11 |
| $C_{12}$ | 1.51 | 1.93 | 1.78 | 1.79 | 2.92 | 2.88 | 2.61 | 1.14 | 0.92 | 1.51 | 1.80 | 2.06 | 1.84 |
| $C_{23}$ | 1.06 | 1.34 | 1.18 | 1.18 | 2.02 | 1.97 | 1.69 | 0.80 | 0.65 | 1.06 | 1.17 | 1.41 | 1.18 |
| $C_{34}$ | 1.06 | 1.17 | 1.32 | 1.18 | 1.67 | 1.69 | 1.69 | 0.80 | 0.65 | 1.06 | 1.45 | 1.17 | 1.18 |
| $C_{45}$ | 1.51 | 1.76 | 1.91 | 1.79 | 2.56 | 2.59 | 2.61 | 1.14 | 0.92 | 1.51 | 2.09 | 1.81 | 1.84 |
| $C_{56}$ | 1.70 | 2.02 | 2.03 | 2.03 | 2.57 | 2.57 | 2.57 | 1.48 | 1.19 | 1.70 | 2.10 | 2.11 | 2.11 |
| $C_{13}$ | - | 0.36 | 0.88 | 0.88 | 0.58 | 0.81 | 1.52 | - | - | - | 0.41 | 0.59 | 1.14 |
| $C_{35}$ | - | 0.89 | 0.51 | 0.88 | 1.54 | 1.50 | 1.52 | - | - | - | 1.15 | 1.15 | 1.15 |
| $S_1$ | off | on | on | on | on | on | on | off | off | off | on | on | on |
| $S_2$ | off | on | on | on | on | on | on | off | off | off | on | on | on |
| $S_3$ | off | on | on | on | on | on | on | off | off | off | on | on | on |

Figure 7:
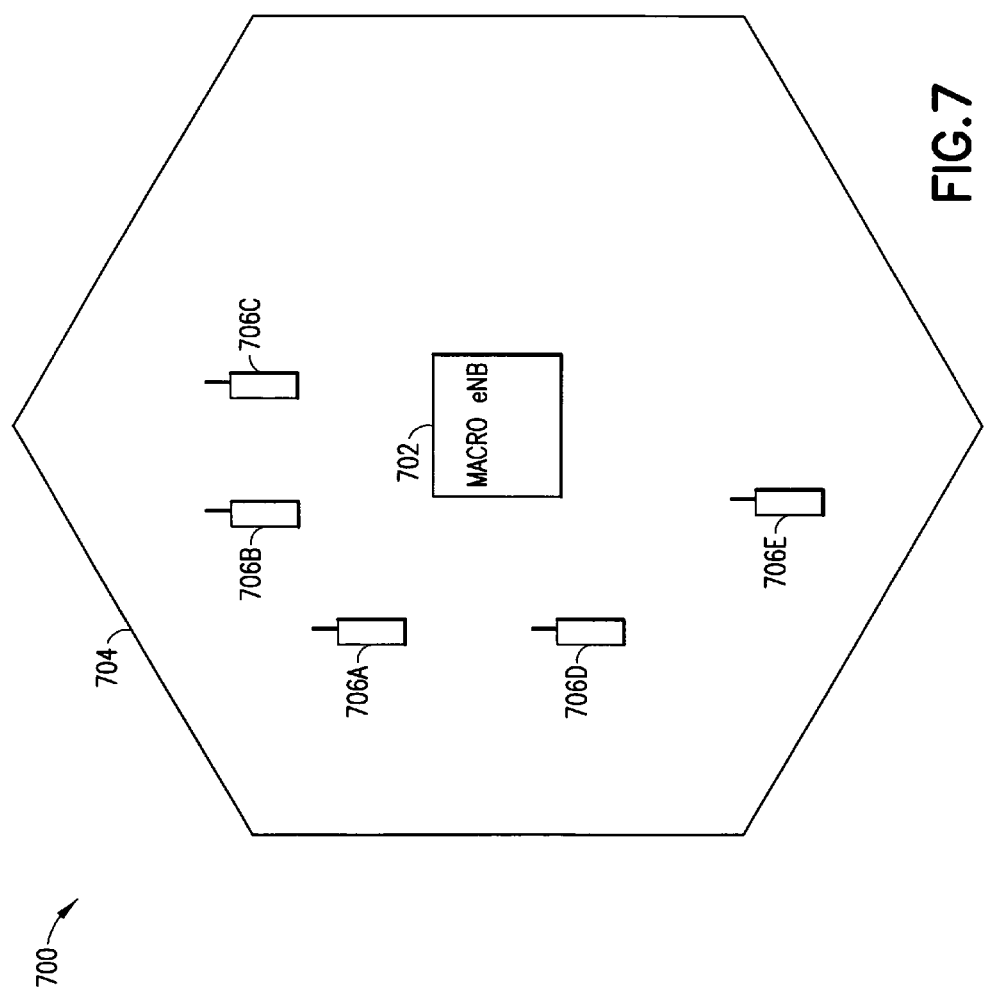
FIG. 7 illustrates a wireless network according to an embodiment of the present invention.

Filters such as the filters 200 and 250 may be used as part of a mobile communication device or a base station in a mobile communication network. FIG. 7 illustrates a network 700 including a base station 702 serving a cell 704. The network 700 may operate as a third generation partnership project (3GPP) long term evolution (LTE) or LTE-advanced (LTE-A, and the base station 702 may be implemented as an eNodeB (eNB). The base station 702 may serve a number of mobile communication devices, implemented as user equipments (UEs) 706A-706E. The user equipments 706A-706E and the base station 702, as well as base stations serving other network cells, may employ tunable filters as illustrated in the various figures and discussed above, to allow for the use of closely spaced frequency bands and adaptation of UEs to use one or another of those bands at a particular time.

Figure 8:
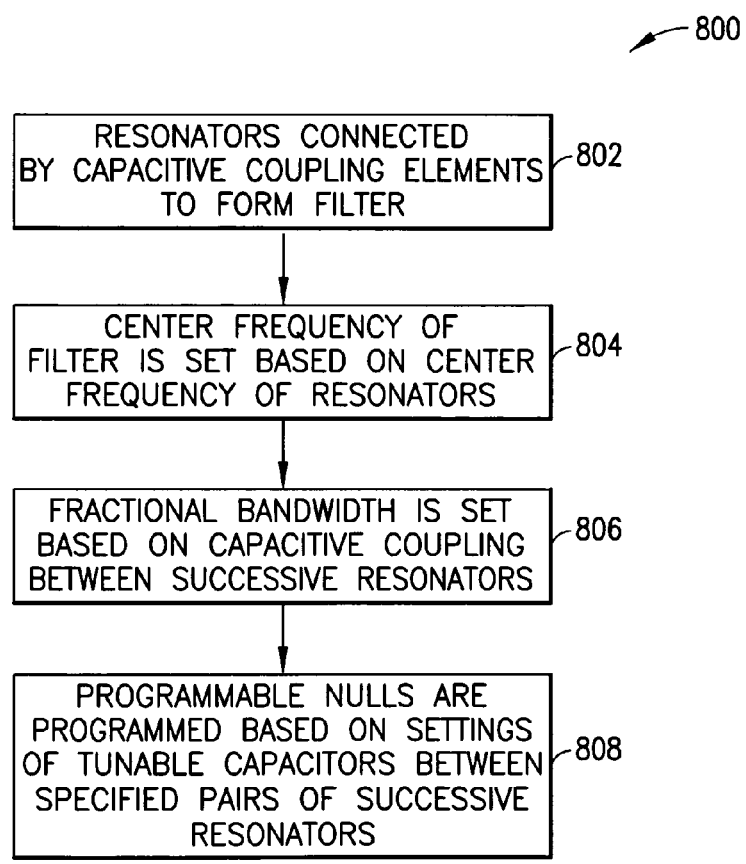
FIGS. 8 and 9 illustrate processes according to embodiments of the present invention.

FIG. 8 illustrates a process 800 of filtering according to an embodiment of the present invention. At block 802, a plurality of resonators are connected by capacitive coupling elements to form a filter. The resonators may be connected by tunable capacitive coupling elements to a load and a source. At block 804, the center frequency of the filter is controlled by tuning the center frequency of the resonators and at block 806, the fractional bandwidth is set based on the capacitive coupling between successive resonators. At block 808, programmable nulls characterizing the filter are programmed based on settings of tunable capacitors between specified pairs of successive resonators. The programmable nulls may appear above the center frequency of the filter.

Figure 9:
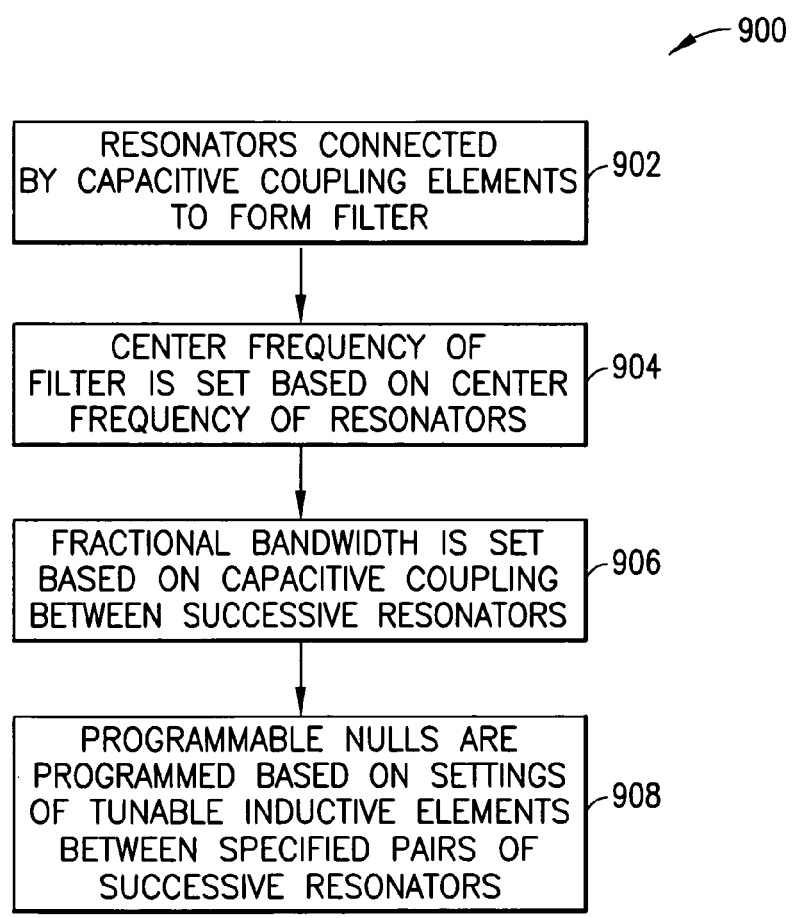

FIG. 9 illustrates an alternative process 900 of filtering according to an embodiment of the present invention. At block 902, a plurality of resonators are connected by capacitive coupling elements to form a filter. The resonators may be connected by tunable capacitive coupling elements to a load and a source. At block 904, the center frequency of the filter is set based on the center frequency of the resonators and at block 906, the fractional bandwidth is set based on the capacitive coupling between successive resonators. At block 908, programmable nulls characterizing the filter are programmed based on tunable inductance values between specified pairs of successive resonators. The programmable nulls may appear above the center frequency of the filter.

Figure 10:
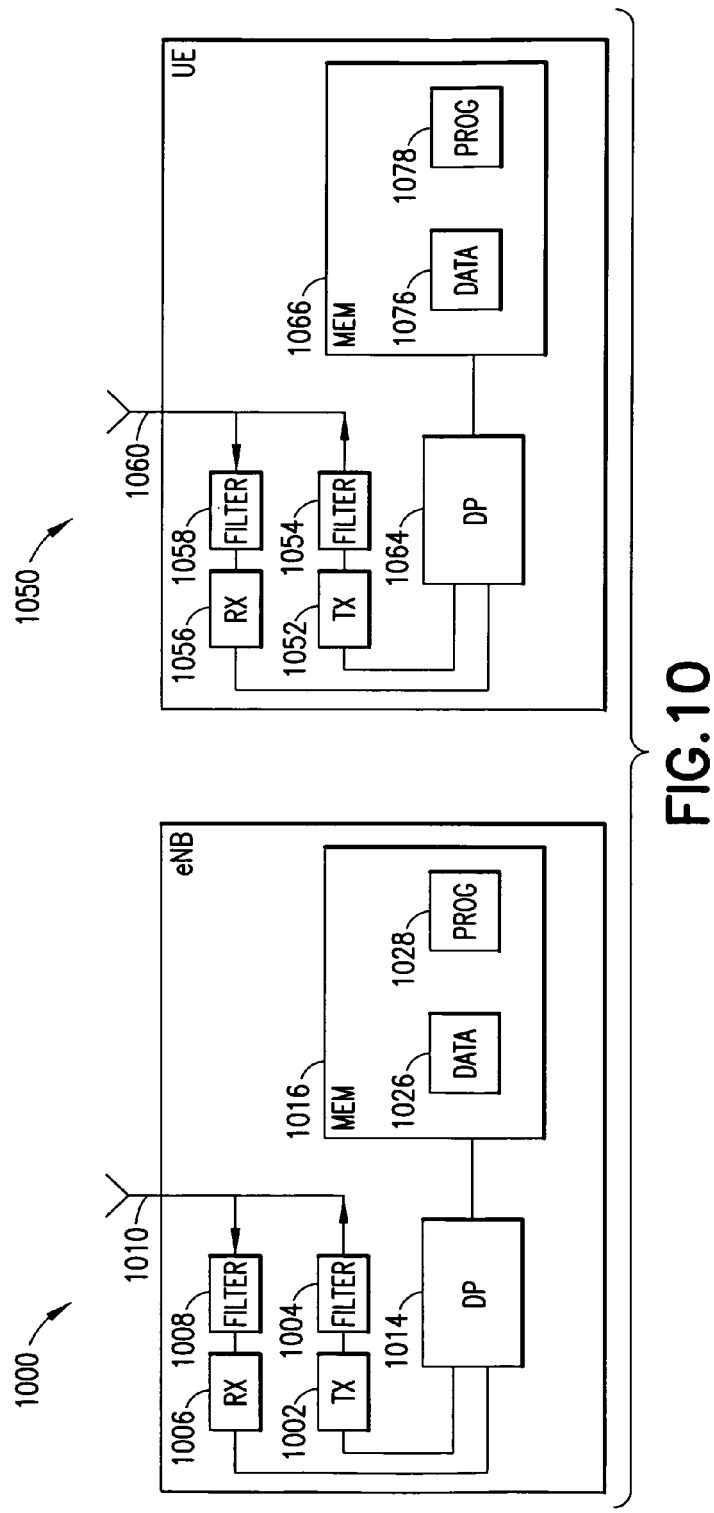
FIG. 10 illustrates elements according to an embodiment of the present invention.

FIG. 10 illustrates details of a base station, implemented as an eNB 1000, and a mobile communications device, implemented as a UE 1050. The eNB 1000 may suitably comprise a transmitter 1002, transmit filter 1004, receiver 1006, receive filter 1008, and antenna 1010. The eNB 1000 may also include a processor 1014 and memory 1016. The eNB 1000 may employ data 1026 and programs 1028, residing in memory 1016.

The UE 1050 may suitably comprise a transmitter 1052, transmit filter 1054, receiver 1056, receiver filter 1058, and antenna 1060. The UE 1062 may also include a processor 1064 and memory 1066. The DE 1050 may employ data 1076 and programs 1078, residing in memory 1066.

At least one of the PROGs 1028 in the eNB 1000 is assumed to include a set of program instructions that, when executed by the associated DP 1014, enable the device to operate in accordance with the exemplary embodiments of this invention, as detailed above. In these regards the exemplary embodiments of this invention may be implemented at least in part by computer software stored on the MEM 1016, which is executable by the DP 1014 of the eNB 1000, or by hardware, or by a combination of tangibly stored software and hardware (and tangibly stored firmware). Similarly, at least one of the PROGs 1078 in the UE 1050 is assumed to include a set of program instructions that, when executed by the associated DP 1064, enable the device to operate in accordance with the exemplary embodiments of this invention, as detailed above. In these regards the exemplary embodiments of this invention may be implemented at least in part by computer software stored on the MEM 1066, which is executable by the DP 1064 of the UE 1050, or by hardware, or by a combination of tangibly stored software and hardware (and tangibly stored firmware). Electronic devices implementing these aspects of the invention need not be the entire devices as depicted at FIG. 7 or FIG. 10 or may be one or more components of same such as the above described tangibly stored software, hardware, firmware and DP, or a system on a chip SOC or an application specific integrated circuit ASIC.

In general, the various embodiments of the UE 1050 can include, but are not limited to personal portable digital devices having wireless communication capabilities, including but not limited to cellular telephones, navigation devices, laptop/palmtop/tablet computers, digital cameras and music devices, and Internet appliances.

Various embodiments of the computer readable MEM 1016 and 1066 include any data storage technology type which is suitable to the local technical environment, including but not limited to semiconductor based memory devices, magnetic mere devices and systems, optical memory devices and systems, fixed memory, removable memory, disc memory, flash memory, DRAM, SRAM, EEPROM and the like. Various embodiments of the DP 1014 and 1064 include but are not limited to general purpose computers, special purpose computers, microprocessors, digital signal processors (DSPs) and multi-core processors.

While various exemplary embodiments have been described above it should be appreciated that the practice of the invention is not limited to the exemplary embodiments shown and discussed here. Various modifications and adaptations to the foregoing exemplary embodiments of this invention may become apparent to those skilled in the relevant arts in view of the foregoing description. It will be further recognized that various blocks discussed above may be performed as steps, but the order in which they are presented is not limiting and they may be performed in any appropriate order with or without additional intervening blocks or steps.

Further, some of the various features of the above non-limiting embodiments may be used to advantage without the corresponding use of other described features.

The foregoing description should therefore be considered as merely illustrative of the principles, teachings and exemplary embodiments of this invention, and not in limitation thereof.

I claim:

1. An apparatus comprising:
  a cross-coupled bandpass filter characterized by a tunable center frequency, tunable fractional bandwidth and one or more programmable transmission zeroes, wherein one of the programmable transmission zeroes is maintained at DC and one of the programmable transmission zeroes is maintained at an infinite frequency.

2. The apparatus of claim 1, wherein the filter comprises a plurality of tunable resonators configured such that:
  the center frequency of the filter is based at least in part on states of one or more of the tunable resonators;
  the tunable resonators are connected one to another by tunable capacitive elements configured such that a fractional bandwidth of the filter is based at least in part on states of one or more of the tunable capacitive elements;
  members of at least one selected pair of the tunable resonators are each connected to one another by a tunable reactive element, wherein each of the tunable reactive elements is configured such that characteristics of a zero of the filter are based at least in part on a state of a tunable reactive element associated with the zero.

3. The apparatus of claim 2, wherein the tunable reactive elements are capacitive elements.

4. The apparatus of claim 2, wherein the tunable capacitive elements are tunable capacitors.

5. The apparatus of claim 2, wherein the tunable reactive elements are inductive elements.

6. The apparatus of claim 2, wherein the tunable reactive elements are inductors.

7. The apparatus of claim 1, wherein the one or more programmable transmission zeroes are below the center frequency of the filter.

8. The apparatus of claim 1, wherein the one or more programmable transmission zeroes are above the center frequency of the filter.

9. The apparatus of claim 1, comprised in a mobile communication device.

10. The apparatus of claim 1, implemented as a stand-alone filter component implemented as a 5-stage cross-coupled bandpass filter exhibiting two independently tunable transmission zeroes.

11. A tunable duplexer comprising two filters according to claim 1, implemented together as a tunable duplexer.

12. The tunable duplexer of claim 11, wherein each of the filters is implemented as a 5-stage cross-coupled bandpass filter exhibiting two independently tunable transmission zeroes.

13. The tunable duplexer of claim 12, wherein each of the filters exhibits a transmission zero of DC and a transmission zero of infinite frequency.

14. The apparatus of claim 1, wherein the filter is configured to operate as either a receive filter or a transmit filter.

15. A method comprising:
  tuning a cross-coupled bandpass filter by:
    setting frequencies of a plurality of cross-coupled tunable resonators to set a center frequency of the filter;
    setting states of tunable capacitive elements coupling the tunable resonators to set a fractional bandwidth of the filter; and setting states of tunable capacitive elements coupling members of selected pairs of the tunable resonators to set programmable transmission zeroes of the filter, wherein one of the programmable transmission zeroes is maintained at DC and one of the programmable transmission zeroes is maintained at an infinite frequency.

16. The method of claim 15, wherein the programmable transmission zeroes are set below the center frequency of the filter.

17. The method of claim 15, wherein the programmable transmission zeroes are set above the center frequency of the filter.

18. The method of claim 15, wherein the filter is a 5-stage cross-coupled bandpass filter exhibiting two independently tunable transmission zeroes.

19. The method of claim 18, wherein the filter is comprised in a mobile communication device.

20. The method of claim 15, wherein the filter is configured to be operable as either a receive filter or a transmit filter.

\* \* \* \* \*